United States Patent
Pohjonen

(10) Patent No.: US 6,944,432 B2
(45) Date of Patent: Sep. 13, 2005

(54) CRYSTAL-LESS OSCILLATOR TRANSCEIVER

(75) Inventor: Helena Pohjonen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/292,410

(22) Filed: Nov. 12, 2002

(65) Prior Publication Data

US 2004/0092234 A1 May 13, 2004

(51) Int. Cl.[7] ................................................. H04B 7/00
(52) U.S. Cl. ........................................ 455/260; 455/76
(58) Field of Search .......................... 455/76, 255, 258, 455/259, 260

(56) References Cited

U.S. PATENT DOCUMENTS

| | | | |
|---|---|---|---|
| 5,615,261 A | * 3/1997 | Grube et al. ................... 380/2 |
| 5,978,656 A | 11/1999 | Farine et al. ................. 455/41 |
| 5,982,241 A | * 11/1999 | Nguyen et al. ............. 331/1 R |
| 6,013,926 A | * 1/2000 | Oku et al. ................... 257/284 |
| 6,242,843 B1 | 6/2001 | Pohjonen et al. ........... 310/313 |
| 6,278,864 B1 | * 8/2001 | Cummins et al. ............. 455/73 |
| 6,308,049 B1 | * 10/2001 | Bellaouar et al. ............. 455/76 |
| 6,380,809 B1 | * 4/2002 | Camp, Jr. .................... 331/17 |
| 6,550,664 B2 | * 4/2003 | Bradley et al. .......... 228/179.1 |
| 6,591,091 B1 | * 7/2003 | Vorenkamp et al. ...... 455/179.1 |
| 2001/0055957 A1 | 12/2001 | Doetsch et al. ............. 455/257 |
| 2002/0045920 A1 | * 4/2002 | Thompson ................... 607/60 |
| 2002/0070262 A1 | 6/2002 | Bradley et al. ............. 228/179 |
| 2003/0041654 A1 | * 3/2003 | Larson et al. .............. 73/64.53 |
| 2003/0060170 A1 | * 3/2003 | Tikka et al. .................. 455/73 |

OTHER PUBLICATIONS

Film Bulk Acoustic Resonator for RF Filter Application, Jpn. J. Appl. Phys. vol. 39 (Jul. 2000), p. 4115 . . . 4199, Part 1, No. 7A, by Sang–hyun Park, Byeng–Chul Seo, Hee–Dae Park and Giwan Yoon.

* cited by examiner

Primary Examiner—Nguyen T. Vo
Assistant Examiner—Nhan T Le
(74) Attorney, Agent, or Firm—Ware, Fressola, Van Der Sluys & Adolphson LLP

(57) ABSTRACT

A radio frequency (RF) transceiver of the type having at least one radio frequency integrated chip (RFIC), a reference oscillator and a phase-locked oscillator, utilizes non-crystal resonator structures in place of crystal oscillators to produce the reference oscillator frequency functionality and the phase-locked oscillator frequency functionality. Film bulk acoustic resonator (FBAR) structures including bulk acoustic wave (BAW) resonators are monolithically integrated or flip chipped with the RFIC to reduce size, weight and cost of the transceiver. The RF transceiver may be a TDMA or CDMA transceiver.

9 Claims, 6 Drawing Sheets

CRYSTAL-LESS OSCILLATOR TRANSCEIVER

TECHNICAL FIELD

The present invention relates generally to multiband radio frequency (RF) transceivers, and deals more particularly with multiband radio frequency transceiver architecture with one or more medium value (e.g. 400 to 8000) quality factor resonators on one or more transceiver radio frequency integrated chips (RFICs). More specifically, the invention deals with crystal-less oscillator RF transceivers and resonator structures to replace crystals used in voltage controlled oscillators (VCO) and reference oscillators in RF transceivers.

BACKGROUND OF THE INVENTION

The migration and development of mobile phones continues towards multiband applications. It is expected that these multiband applications could require a combination of several various or complicated modulation methods in the transceiver, such as, for example, Enhanced Data Rates for Global Evolution (EDGE) frequency modulation and amplitude modulation. Further complicating matters is the trend in mobile phones toward increased integration of features and services. This drive towards higher integration has led to a situation where most of the functions are now integrated in one or more RFICs to reduce the size or avoid increases in the size of the mobile phone. These functions include for example, up/down converters, LNAs, Phase Locked Loops (PLL), amplifiers/buffers, and other such functionalities in devices and apparatus used in wireless communication systems. Depending on the selected radio architecture, multiple different oscillators are needed in a transceiver to provide down/up conversion, channel selection and modulation for a given system and modulation method.

Currently known multiband RF transceivers such as the type utilized in cellular communication systems typically use crystal resonator oscillators. The number of different crystal resonator oscillators is the main source of transceiver cost and size, and make the greatest contribution to performance. Generally, the crystal resonators are packaged separately and mounted on the motherboard as separate components or modules for the oscillator. The crystal resonator packages typically also include the tuning and amplifying electronics for the oscillator. The crystal resonator packages add weight to the transceiver and the crystal and resonating components are susceptible to damage from shock or impact forces if the transceiver is dropped due to the mass of the package and the component mounting and attachment means' ability to withstand such forces. One approach to reducing the size of the transceiver is to select an RF architecture such as direct conversion and modulation methods which use a minimum number of oscillators and thus can save space and volume compared to other RF architectures. Attempts at further integration typically integrate the amplifier functions of the reference oscillators on the same chips with the PLLs, however, the crystal itself is left as an external component, i.e., not integrated with the PLL chips. Further, some of the required component functions, such as from, crystals and resonators do not lend themselves to and are often very difficult to miniaturize, hybridize and integrate due primarily to incompatibility with the most often used semiconductor such as, silicon and gallium arsenide technologies in the integration.

Crystal based oscillators are preferred in multiband radio frequency transceiver because they provide a high Q value for the reference oscillator function. As supporting component functions such as phase detectors in PLL's operate at much higher frequencies due to development, improvement and implementation of integrated circuit technologies, the reference oscillator frequencies are likewise required to increase in frequency. It is expected that to achieve the higher frequencies and size reduction objectives, it will be increasingly difficult to manufacture crystals that will need to be physically very small, light and have tight tolerance characteristics. Further difficulties accompany the mechanical manufacturing aspects, such as, crystal lapping, precision cutting and contact joining for example, by wire or lead bonding/joining techniques.

Another shortcoming is the packaging methods such as wire bonding typically used in the packaging of the reference crystals or crystals in the reference oscillator modules leads to calibration requirements during and/or after production of the transceiver or the reference oscillator module. Typically, this calibration is made with help of switchable capacitors for use in adjusting the center frequency of the oscillator. Also, inaccuracy of low Q value resonators used in VCO's may require center frequency calibration in the production of the VCO oscillator modules. The reader is referred to textbooks and technical journals available in the literature for further detailed information relating to the design issues relating to performance and for additional explanations of the limitations of crystals and crystal oscillators and their respective operational limitations.

Additionally, the monolithic integration of high Q (>10000) value resonators has not been technically feasible due to different material compatibility requirements such as, for example, between silicon which to date is the most widely used media for IC integration and quartz as found in crystals, or SAW resonators on lithium niobate or lithium tantalate to name a few.

It would be desirable therefore to provide a crystal-less resonator structure and a method of implementing resonators for use in place of crystals in VCOs and reference oscillators including voltage controlled, temperature controlled crystal oscillators (VC(TC)XOs). It is desirable that the crystal-less resonator structure be implemented as thin film based resonators (FBAR, BAW) integrated or flip chipped on top of a RFIC or RFICs which may possibly include a phase-locked-loop (PLL) as used in TDMA systems or possibly multiple PLL chips which would be needed for example, in transceivers having simultaneous transmit and receive capability as required in CDMA systems. Integrating additional RF band functionality, such as for example, global positioning system (GPS) capability into the transceiver may require one or more additional oscillator/crystal functions which further increase cost and complexity of the transceiver. It is desirable therefore to also use crystal-less resonator structures to implement such additional RF band functionalities.

It is an object therefore of the present invention to provide a highly miniaturized RF transceiver based on RFIC or multiple RFICs possibly including a PLL or multiple PLLs including all necessary resonators in the form of FBAR (film bulk acoustic resonator) or BAW (bulk acoustic wave resonator) for the VCO or VCOs and a reference oscillator either flip chipped or monolithically integrated on the same chip with the PLL or PLLs used in the RF transceiver system.

SUMMARY OF THE INVENTION

The advantages of this invention are clearly smaller size, fewer number of parts and very light resonators providing cost savings and robustness against shocks/drops of portable transceiver equipment.

In a first aspect of the invention, a radio frequency (RF) transceiver of the type having at least one radio frequency integrated chip (RFIC), a reference oscillator and a phase-locked oscillator, utilizes a first resonator structure as the reference oscillator and a second resonator structure as the phase-locked oscillator.

Preferably, the first resonator structure is a first film bulk acoustic resonator (FBAR) structure and the second resonator structure is a second film bulk acoustic resonator (FBAR) structure.

Preferably, the first and second FBAR structures are monolithically integrated with the RFIC chip.

Preferably, the first and second FBAR structures are flip chipped on the RFIC chip.

Preferably, the first resonator structure and the second resonator structure are bulk acoustic wave resonator (BAW) structures. The BAW resonator structures may be of the type manufactured with thin film techniques or alternately any suitable manufacturing technique including but not limited to thick film techniques or other film layer fabrication techniques.

Preferably, the quality factor (Q) of the first and second resonator structures has a value in the range of about 400 to 8000.

Preferably, the RFIC chip further includes a phase-locked loop (PLL) chip.

BRIEF DESCRIPTION OF THE DRAWINGS

Other objects, features, and advantages of the present invention will become readily apparent from the following written description of the invention taken in conjunction with the accompanying drawings wherein.

DETAILED DESCRIPTION OF PREFERRED EMBODIMENTS

Figure 1:
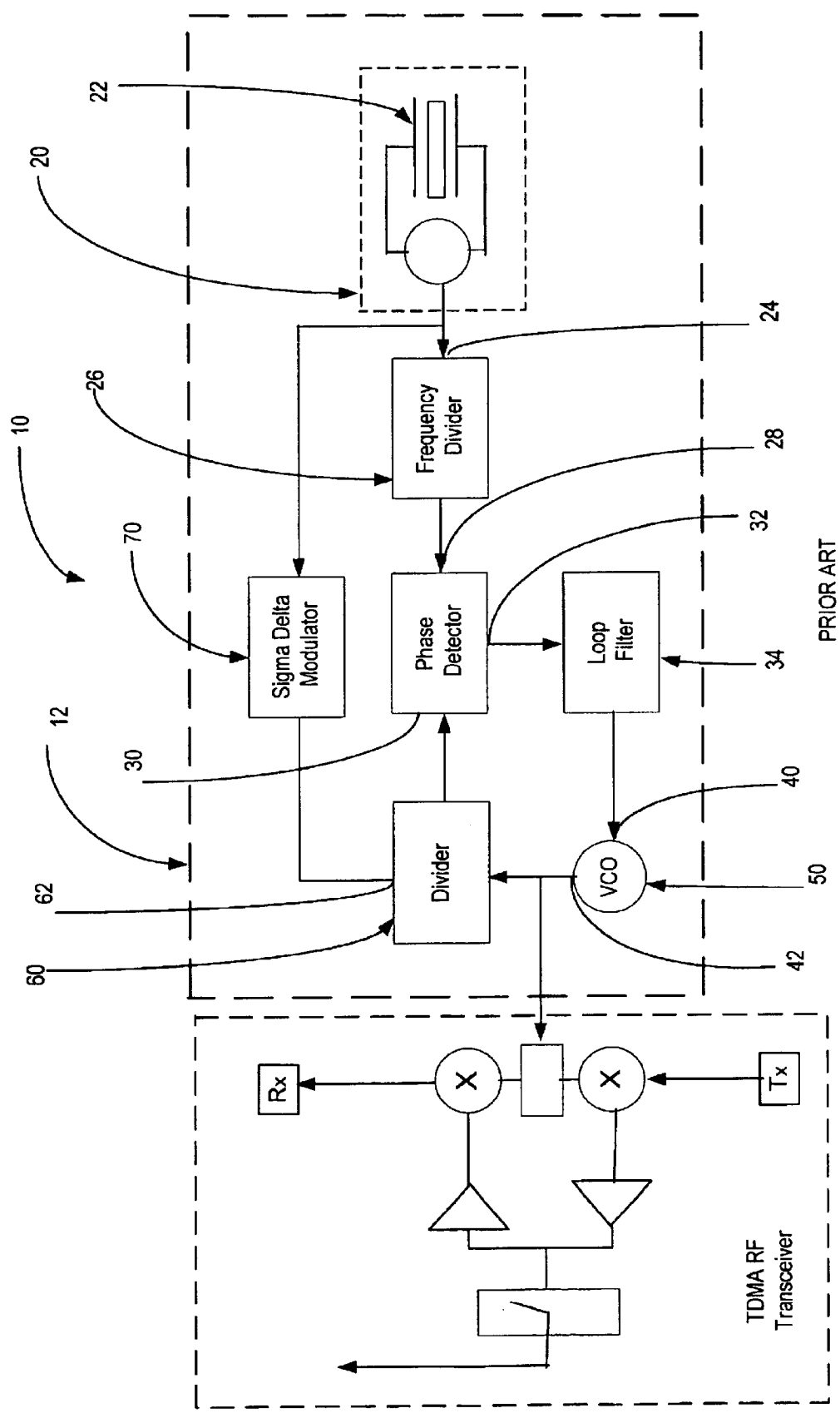
FIG. 1 is a functional block diagram of a time division (TDMA) transceiver based on a direct conversion RF architecture using a crystal reference oscillator and a voltage controlled oscillator of the type in the prior art with which the present invention may be employed to replace the crystal reference oscillator.

Turning now to the drawings and considering the invention in further detail, a schematic functional block diagram of a conventional time division multiple access (TDMA) RF transceiver of the type with which the present invention may be employed is illustrated therein and generally designated 10. It will be recognized and understood by those skilled in the RF transceiver art that the present invention may be employed in other than TDMA transceivers for example, in code division multiple access (CDMA) or other access methodologies now known or future developed. The TDMA RF transceiver 10 illustrated in FIG. 1 is based on a direct conversion RF architecture in which a minimum number of two oscillators are needed to generate the desired frequencies. In FIG. 1, a frequency synthesizer shown in the dash line box 12 generates the desired frequencies using a phase-locked Loop (PLL), the operation of which PLL is generally well understood by those skilled in the art and will therefore only be described herein to the extent needed to understand the characteristics and typical operational parameters of the crystal oscillators used therein for the purposes of comparison and to more fully understand the operation and benefits of the crystal-less transceiver and resonator structures of the present invention. In the example shown in FIG. 1, a reference frequency oscillator generally designated 20 is required to maintain the phase of a second oscillator generally designated 50 locked. The second oscillator 50 is generally a voltage controlled oscillator (VCO) or a ultra high frequency voltage controlled oscillator (UHFVCO). The reference frequency oscillator 20 is generally a crystal oscillator capable of generating frequencies in the range of 10 to 50 Megahertz using a crystal 22 as a resonator. The crystal resonator 22 has a relatively high Q value in the range of 10,000 to 30,000. The frequency of the crystal based reference oscillator is selected based on a number of factors including the speed of the phase detector and the settling or lock time of the PLL. The second oscillator or UHFVCO 50 typically operates at a frequency of about 500 Megahertz to 5 Gigahertz and has a relatively low Q value in the range of about 20 to 60. The UHFVCO 50 resonator may typically consist of coils and/or resonators implemented on a printed wiring board (PWB) such as for example the system and/or oscillator module motherboard or directly on for example, a silicon or gallium arsenide integrated circuit using one or several the thickest metal layers. The integrated circuit may also contain a varactor or similar component functionality for voltage control and amplification circuitry.

In FIG. 1, the frequency at the output 24 of the reference frequency oscillator 20 is input to a frequency divider 26 to produce a desired lower frequency that is fed to the input 28 of a phase detector 30. The output 32 of the phase detector 30 carries the loop error represented by a voltage or current and is input to the loop filter 34 whose output is coupled to the input 40 of the VCO 50 to adjust the frequency (phase) at the output 42 of the VCO 50. The output 42 of the VCO 50 is also coupled to the input of a divider 60 located in the loop feed back path between the VCO 50 and the phase detector 30. The divider 60 can be an integer or fractional divider, but typically the divider 60 is a multi-modulus divider to provide smaller steps and faster settling time capability for the PLL. Optionally, a delta sigma modulator functionality generally designated 70 can be placed in the path between the output of the frequency divider 26 and an input 62 of the divider 60 to provide even faster settling or lock times and smaller incremental steps for better accuracy.

Figure 2:
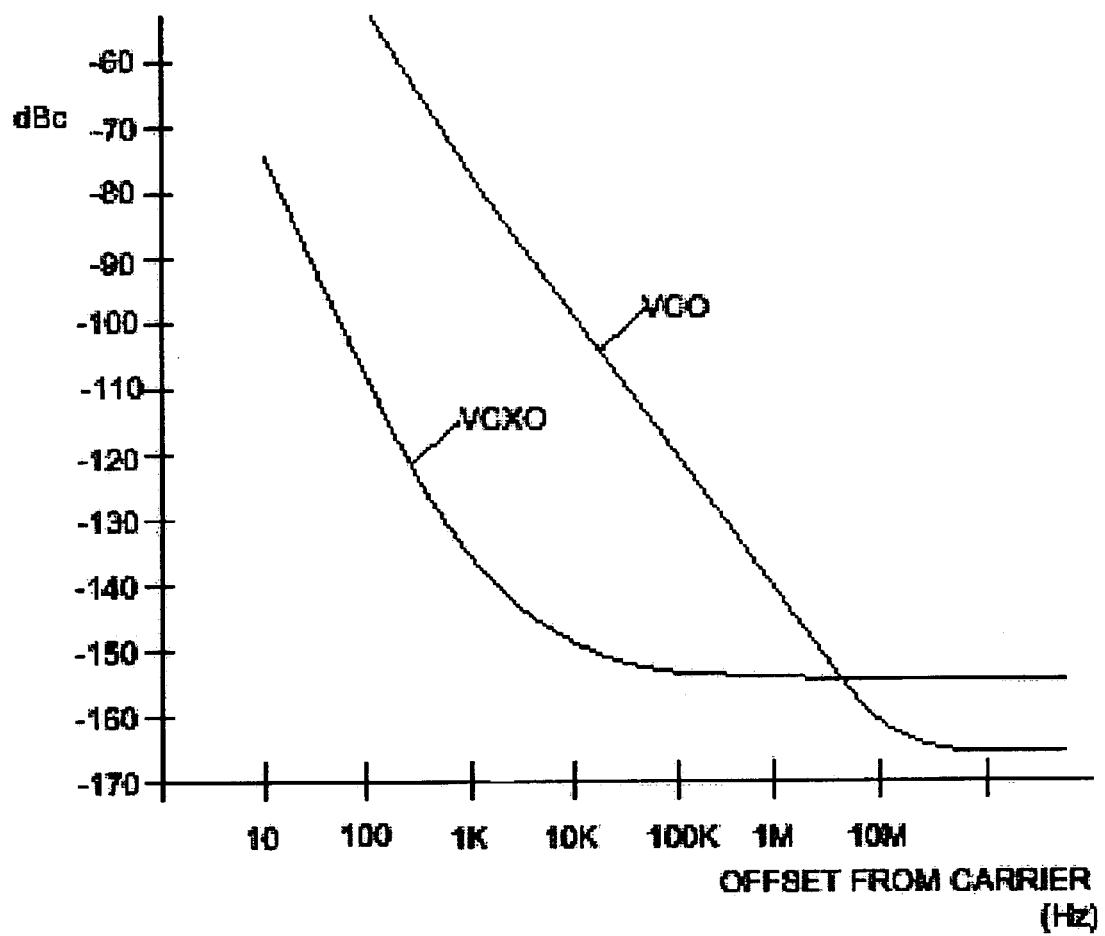
FIG. 2 is a graphic representation of the phase noise versus offset from carrier frequency characteristic of a voltage controlled crystal oscillator (VCXO) and VCO, respectively.

It is necessary that the FBAR or SAW resonator replicate the operating characteristics of crystal based resonators to provide the desired combination of increased reference oscillator frequency, a higher integration level, smaller size and more predictable operation at faster speeds with low cost and minimum parts count and at least at the same noise performance level. A discussion of the various characteristics of crystal based oscillators and PLLs used in RF transceivers follows. Typically crystal based oscillators at low frequencies have lower phase noise compared to voltage controlled oscillators (VCOs). In contrast, crystal based oscillators have higher phase noise at higher frequencies and offset from the carrier noise floor as compared to VCOs. Referring to FIG. 2, the phase noise versus offset from carrier frequency characteristic designated 80 of a crystal based reference oscillator and the phase noise versus offset from carrier frequency characteristic designated 82 of a voltage controlled oscillator are illustrated in graphic representation form therein. It can be seen that the crystal based oscillator characteristic represented by the curve 80 has a lower phase noise at the lower frequencies compared to the VCO and the VCO characteristic represented by the curve 82 has a lower phase noise at higher frequencies compared to the crystal based oscillator.

Figure 3:
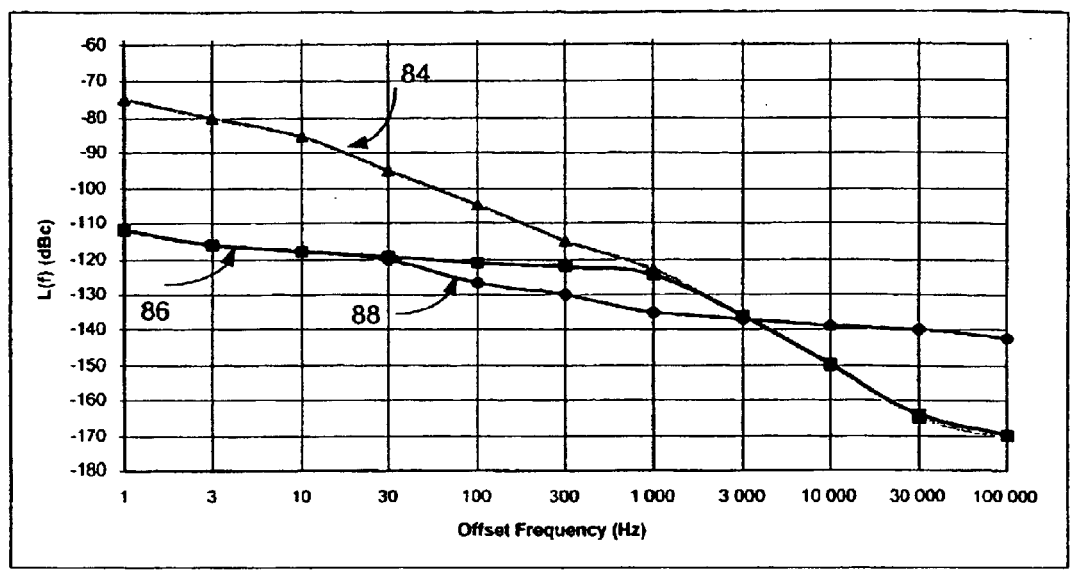
FIG. 3 is a graphic representation of the phase noise versus offset from carrier frequency characteristic of a PLL.

In portable PLL RF transceivers the VCO frequency is locked with the reference oscillator phase. The reference oscillator determines the PLL phase noise within the PLL bandwidth and the VCO is the dominant contributor to PLL phase noise outside the PLL bandwidth. When a crystal based reference oscillator with a relatively high Q value and VCO having phase noise characteristics such as illustrated in FIG. 2 are used in a PLL, it is seen in FIG. 3 that the phase noise characteristic designated 86 of the PLL consists of the phase noise characteristic designated 84 of the VCO and the phase noise characteristic designated 88 of the crystal based reference oscillator. A crystal based reference oscillator using a crystal resonator with a very high Q value factor provides a very low phase noise at a relatively small offset for example, at a 1 kHz offset from the carrier frequency.

There are also other elements contributing the PLL phase noise as discussed below. It is known that spectral density L of an oscillator is dependent on the quality factor Q of the resonator, center frequency $f_o = w_o/(2\pi)$ offset from the center frequency $Dw_o$ and the power of the carrier frequency ($P_{sig}$) as defined by the following formula:

$$L = \left[ \frac{2kT}{P_{sig}} \left( \frac{w_o}{2QDw_o} \right)^2 \right]$$

where T is temperature and k is the Boltzman's constant. A plot of the solution of the formula coincides with the curves illustrated in FIG. 3. However it is clear that higher Q values at the same offset frequency and signal level of the oscillator produces lower spectral density and thus lower phase noise. It is also known that the total phase noise in a PLL based system includes VCO phase noise, reference oscillator phase noise, thermal and device noise from components in the loop filter, noise from frequency dividers needed to generate the desired frequencies, and noise of the frequency/phase detector.

Figure 4:
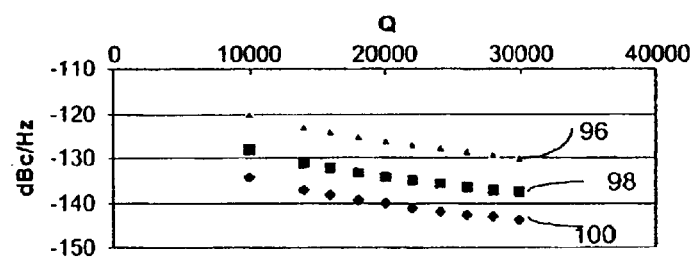
FIG. 4 is a graphic representation of the phase noise characteristic of a typical reference oscillator.
Figure 5:
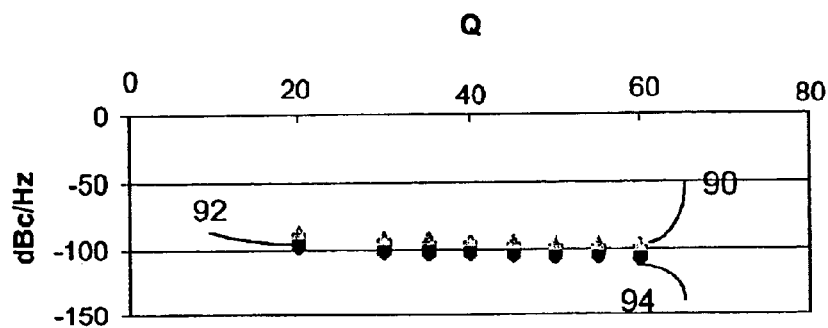
FIG. 5 is a graphic representation of the phase noise characteristic of a typical ultra high frequency voltage controlled oscillator (UHFVCO)

The phase noise characteristics of typical known voltage controlled oscillators using on or off chip coils or microstrip or stripline resonators with typical power signal (Psig) at 1 kHertz offset versus Q value are shown in FIG. 4 for center frequencies at 1, 2 and 4 gigahertz as represented by the curves designated 90, 92 and 94, respectively. In some special cases the Q value may range between 40 and 60. The phase noise characteristics of typical known voltage controlled crystal oscillators with typical Psig at 1 kHertz offset versus Q value are shown in FIG. 5 for center frequencies at 10, 20 and 50 megahertz as represented by the curves designated 96, 98 and 100, respectively.

Figure 6:
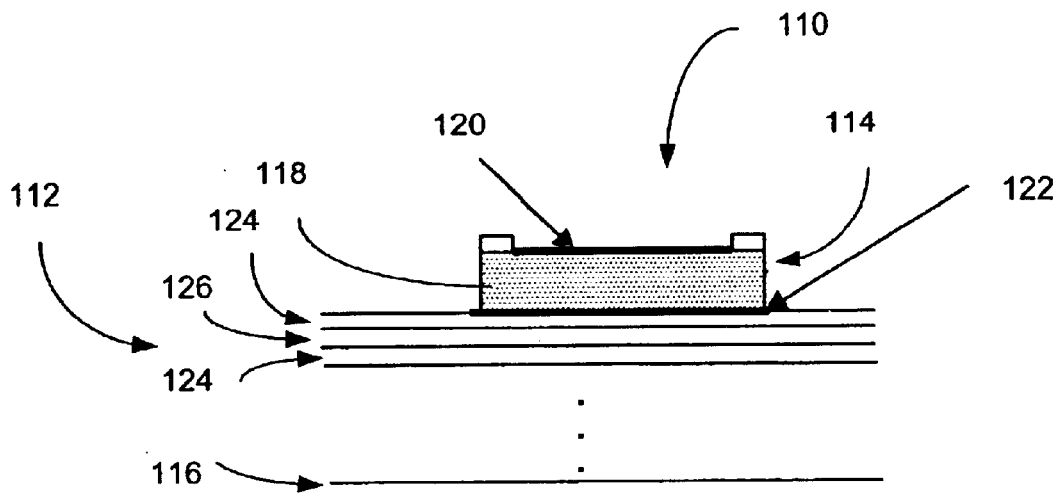
FIG. 6 is a schematic representation of a first basic FBAR/BAW resonator structure.
Figure 7:
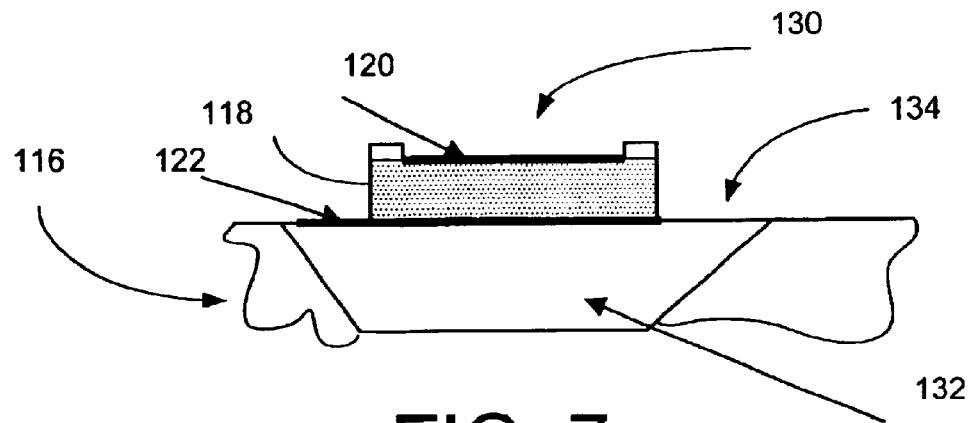
FIG. 7 is a schematic representation of a second basic FBAR/BAW resonator structure.

Thin film FBAR (film bulk acoustic) or BAW (bulk acoustic wave) resonators such as those contemplated by the present invention for use in RF transceivers in the place of crystals are manufactured with microelectronic techniques typically with a 6 to 15 mask layer process depending on the specific structure. FIG. 6 shows in schematic form a FBAR resonant structure generally designated 110 wherein an acoustic mirror generally designated 112 is located below the resonator 114 to provide acoustic isolation between the structure and the substrate generally designated 116. The resonator 114 comprises a layer 118 of piezo material such as Aln, ZnO, PZT or any other piezoelectric material which may be of any suitable type to accomplish the intended function. The resonator further includes an outer or top electrode 120 on one face of the piezoelectric layer 118 and a lower or bottom electrode 122 on the face of the piezoelectric layer 118 oppositely disposed from the top layer and facing the acoustic mirror 112. The acoustic mirror 112 is comprised of a stack of alternating high acoustic impedance layers 124 and low acoustic impedance layers 126 between the bottom electrode 122 and the substrate 116. The acoustic mirror 112 frees the resonator 114 for resonance. The resonance frequency of the resonator 114 is determined by the thickness of the piezoelectric layer 118. The substrate 116 is typically silicon, gallium arsenide, glass or suitable insulator material well known in the art. The quality (Q) factor of a FBAR resonator varies, depending on the measurement accuracy and the definition of the Q value, typically between 500 to 1200, but even higher Q values in the range of 7700 or more have recently been reported in a paper by Park et. al. titled "Film Bulk Acoustic Resonator Fabrication for RF Filter Application" at the College of Engineering, Information, and Communications University, Korea, and accepted for publication on Apr. 6, 2000, the disclosure of which is incorporated herein by reference. FIG. 7 shows in schematic form another exemplary FBAR resonant structure generally designated 130 similar to that shown in FIG. 6 and like reference numerals refer to like parts. The bottom electrode 122 of the resonator 114 is located or otherwise mounted at the opening 134 of a cavity or bridge generally designated 132 formed in the substrate 116 thus freeing the resonator for resonance. The cavity 132 is also referred to as an air cavity.

Figure 8:
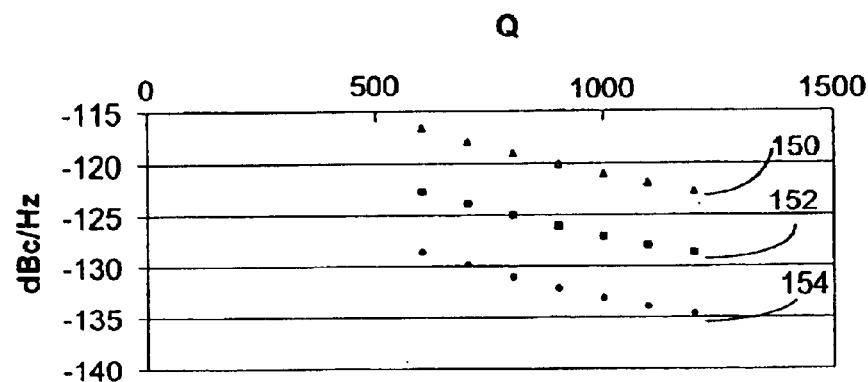
FIG. 8 is a graphic representation of the phase noise characteristic of a ultra high frequency voltage controlled oscillator (UHFVCO) versus Q values in the range of 600 to 1200 of a FBAR resonator with a typical power signal (Psig) at a one kilohertz offset frequency.

Referring to FIG. 8, the phase noise characteristic of a ultra high frequency voltage controlled oscillator (UHFVCO) versus Q values in the range of 600 to 1200 of a FBAR resonator with a typical power signal (Psig) at a one kilohertz offset frequency is illustrated therein for center frequencies at 1, 2, and 4 gigahertz as represented by curves 150, 152 and 154, respectively. It will be noticed that there is a marked improvement or decrease in the VCO phase noise if the oscillator power and resonance frequency are kept the same. By comparing know typical crystal based reference oscillator phase noise characteristics at low oscillation frequencies for example between 10 to 50 MHz as illustrated in FIG. 4, and the VCO phase noise based on FBAR resonator Q values and typical VCO signal levels as in FIG. 8, it is seen that the phase noise characteristics approximate one another when the resonance frequency is sufficiently high. The only differentiating factors are the oscillation frequency and the typical signal levels.

Figure 9:
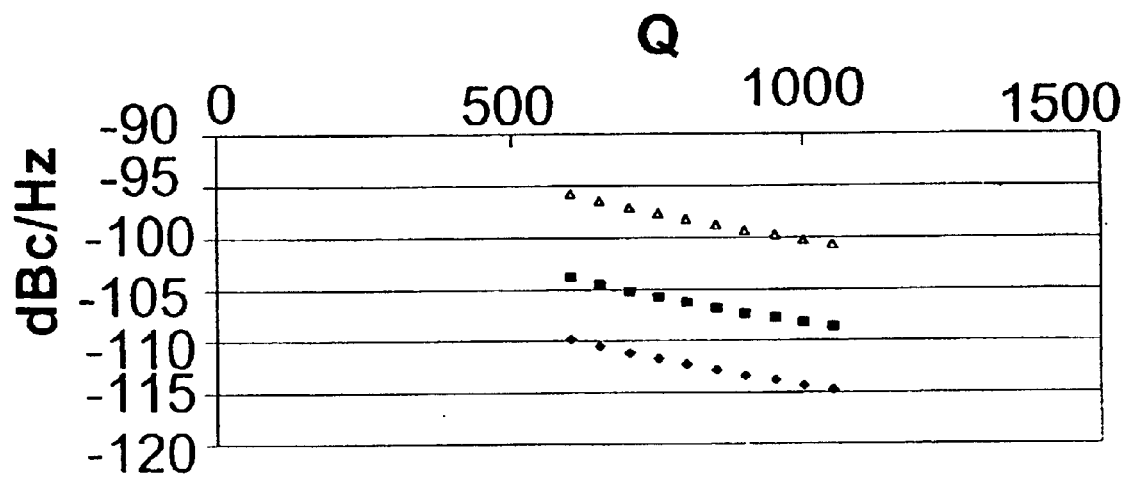
FIG. 9 is a graphic representation of the phase noise characteristic in a conventional crystal oscillator employing a FBAR resonator having a Q value in the range of 600 to 1200 in place of the crystal.

Replacing the crystal with an FBAR or BAW resonator structure in a reference oscillator results in a dramatic increase of phase noise due to lower Q values ($Q_{FBAR}$~400 to 1200 versus. $Q_{crystal}$~10000 to 30000). The increase is manifested when the oscillation frequency and signal level of the oscillator is maintained substantially the same as illustrated in FIG. 9. However, the resonance frequency of a FBAR resonator is determined by the thickness of piezoelectric material layer wherein the thinner the layer, the higher the resonance frequency. Resonators that resonate at frequencies lower than 400 MHz are not practical for manufacturing because of the long manufacturing time required to apply the piezoelectric layer using deposition and/or sputtering techniques for example. Therefore the situation illustrated in FIG. 9 is in actuality at this time theoretical and is presented to show the effect of decreased Q value to the oscillator phase noise. As newer manufacturing techniques and processes evolve, it is expected that such resonators will become practical to manufacture and available and accordingly the present invention contemplates such future developments.

A further reduction in the phase noise of about 20 dB/decade is realized through frequency division of the 100 to 400 MHz generated by the FBAR resonator to obtain the lower frequencies needed for the reference oscillator. For example, the frequency division from 5 GHz to 50 MHz alone may decrease the phase noise by 40 dB. However, the frequency division process may also contribute additional noise to the final phase noise of the oscillator, but this affect can be minimized by careful design for example by selecting suitable, noise optimized biasing components or using noise cancellation methods. However, newer innovative and novel fast settling PLLs for example, based on fractional frequency division allow the use of a higher reference frequency compared to that of integer PLLs and thus minimizes or substantially eliminates the need for frequency division of the reference oscillator frequency. A further benefit of the higher frequency reference oscillator and faster settling PLLs is a reduction in power consumption because fewer components are required to be powered.

The foregoing factors make it possible to replace a low frequency, typically 10 to 50 MHz crystal having a relatively high value Q quality factor in the range of about 10000 to 30000, based reference oscillator with a high frequency in the range of about 400 MHz to 5 GHz medium value Q quality factor in the range of about 400 to 1200 and up to 7700, thin film FBAR resonator based oscillator and achieve at least same performance, PLLs and frequency synthesizers in portable transceivers with smaller size, lower parts count and increased robustness against shock and drop due to decreased weight of resonating elements.

From the RF system specification and manufacturability that is the thickness of piezoelectric layer of the FBAR resonator viewpoint, it is possible to achieve a sufficiently high frequency for instance the 5 GHz frequency in the example above which provides a sufficiently low phase noise characteristic for both the reference and UHFVCO oscillators in the transceiver. If the same oscillation frequency is used for both the reference oscillator and the UHFVCO oscillator, full monolithic integration or flip chip of the resonators for the reference and VCO oscillators or for the reference oscillator only is possible using the FBAR resonator as described above. It is also possible and practical to use a FBAR resonator for a high frequency (>3 GHz) reference oscillator only because presently known low Q based UHFVCO solutions are adequate from the phase noise performance viewpoint.

Using medium quality factor FBAR or BAW resonators either monolithically integrated or as flip chipped on the same semiconductor substrate or substrates as the RFIC(s) where the other needed transceiver functions are located, leads to ultimate miniaturization, reduction in chipsize(s) and fewer parts count minimizing packaging and use of materials and thus minimized cost.

Figure 10:
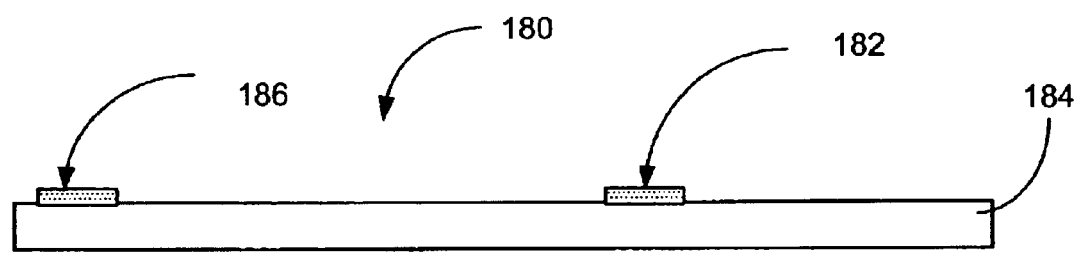
FIG. 10 is a schematic representation of an embodiment of a FBAR resonator monolithically integrated with a RFIC to provide the transceiver oscillators.
Figure 11:
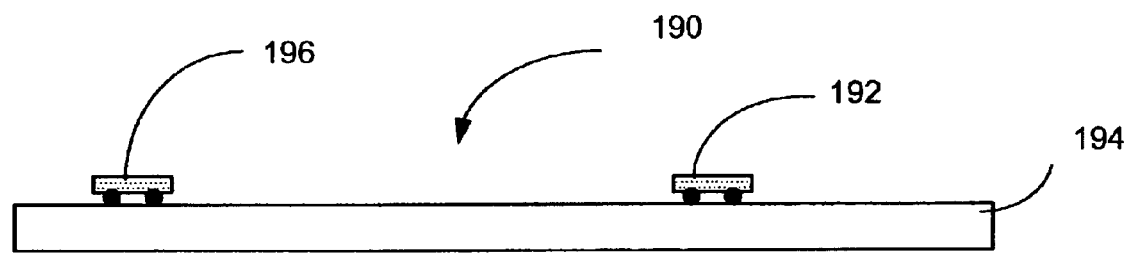
FIG. 11 is a schematic representation of an alternate embodiment of a FBAR resonator flip-chipped on the RFIC to provide the transceiver oscillators.

FIG. 10 illustrates schematically one possible embodiment generally designated 180 of a FBAR resonator 182 monolithically integrated with a RFIC 184 to provide the reference oscillator frequency functionality and a FBAR resonator 186 monolithically integrated with the RFIC 184 to provide the VCO frequency oscillator functionality. FIG. 11 illustrates schematically a possible embodiment generally designated 190 of a FBAR resonator 192 flip chipped to a RFIC 194 to provide the reference oscillator frequency functionality and a FBAR resonator 196 flip chipped to the RFIC 194 to provide the VCO oscillator frequency functionality.

By joining FBAR resonator(s) by flip chip on the RFIC which may also include the PLL functionality or on RFICs either very near or physically tightly with oscillator(s) is a cost effective design and implementation option to full integration. The increased mask count due to the FBAR and monolithic integration may increase the manufacturing cost of the RFIC chip(s) more than linearly versus the cost of the increased mask count. Obviously, as manufacturing techniques are improved or as new manufacturing techniques evolve, the situation may change and full integration of the FBAR resonator may become more economical.

A crystal-less transceiver and resonator structures for replacing crystals used in voltage controlled oscillators (VCO) and reference oscillators in RF transceivers have been presented above in several preferred embodiments. Numerous changes and modifications may be made to the above embodiments without departing from the spirit and scope of the present invention. For example, the manufacturing techniques for the resonator structure may change as appropriate to accommodate and operate with a given RFIC. Accordingly, the present invention has been disclosed by way of example rather than limitation.

What is claimed is:

1. A radio frequency (RF) transceiver of the type having at least one radio frequency integrated chip (RFIC), a reference oscillator and a phase-locked oscillator, characterized in that said reference oscillator comprises a first resonator structure wherein said first resonator structure is a first film bulk acoustic resonator (FBAR) structure and said phase-locked oscillator comprises a second resonator structure wherein said second resonator structure is a second film bulk acoustic resonator (FBAR) structure further characterized in that said second resonator structure comprises a low Q based UHFVCO and said first resonator structure is a first film bulk acoustic resonator (FBAR) structure monolithically integrated with a first radio frequency integrated chip (RFIC) to define a high frequency (>3 gigahertz) reference oscillator frequency functionality.

2. The RF transceiver according to claim 1 wherein said first and second FBAR structures are monolithically integrated with the RFIC chip.

3. The RF transceiver according to claim 2 characterized in that the RFIC chip further includes a phase-locked loop (PLL) chip.

4. The RF transceiver according to claim 1 wherein said first resonator structure and said second resonator structure further comprise bulk acoustic wave resonator (BAW) structures.

5. The RF transceiver according to claim 1 further characterized in that the quality factor (Q) of said first and second resonator structures has a value in the range of about 400 to 8000.

6. The RF transceiver according to claim 1 further characterized by a TDMA RF transceiver.

7. The RF transceiver according to claim 1 further characterized by a CDMA RF transceiver.

8. A radio frequency (RF) transceiver of the type having at least one radio frequency integrated chip (RFIC), a reference oscillator and a phase-locked oscillator, characterized in that said reference oscillator comprises a first resonator structure wherein said first resonator structure is a first film bulk acoustic resonator (FBAR) structure and said phase-locked oscillator comprises a second resonator structure wherein said second resonator structure is a second film bulk resonator (FBAR) structure further characterized in that said second resonator structure comprises a low Q based UHFVCO and said first resonator structure is a first film bulk acoustic resonator (FBAR) structure flip chipped with a first radio frequency integrated chip (RFIC) to define a high frequency (>3 gigahertz) reference oscillator frequency functionality.

9. The RF transceiver according to claim 8 wherein said first and second FBAR structures are flip chipped on the RFIC chip.

* * * * *

UNITED STATES PATENT AND TRADEMARK OFFICE
CERTIFICATE OF CORRECTION

PATENT NO. : 6,944,432 B2
DATED : September 13, 2005
INVENTOR(S) : Helena Pohjonen It is certified that error appears in the above-identified patent and that said Letters Patent is hereby corrected as shown below:

Column 9,
Line 1, "whereinsaid" should be -- wherein said --.

Signed and Sealed this

Thirteenth Day of December, 2005

JON W. DUDAS
*Director of the United States Patent and Trademark Office*